(12) United States Patent
Beran (10) Patent No.: US 11,375,622 B2
(45) Date of Patent: Jun. 28, 2022

(54) METHOD AND DEVICE FOR POSITIONING A COMPONENT ARRANGED ON A SUBSTRATE

(71) Applicant: Fraunhofer-Gesellschaft zur Förderung der angewandten Forschung e.V., Munich (DE)

(72) Inventor: Philip Beran, Erlangen (DE)

(73) Assignee: Fraunhofer-Gesellschaft zur Förderung der angewandten Forschung e.V., Munich (DE)

(*) Notice: Subject to any disclaimer, the term of this patent is extended or adjusted under 35 U.S.C. 154(b) by 6 days.

(21) Appl. No.: 17/130,724

(22) Filed: Dec. 22, 2020

(65) Prior Publication Data

US 2021/0112668 A1  Apr. 15, 2021

Related U.S. Application Data

(63) Continuation of application No. PCT/EP2019/066652, filed on Jun. 24, 2019.

(30) Foreign Application Priority Data

Jun. 29, 2018 (DE) .................. 10 2018 210 735.1

(51) Int. Cl.
  *H05K 3/30* (2006.01)
  *G01R 33/02* (2006.01)
  *H05K 1/14* (2006.01)

(52) U.S. Cl.
  CPC ............. *H05K 3/303* (2013.01); *G01R 33/02* (2013.01); *H05K 1/145* (2013.01)

(58) Field of Classification Search
  CPC .......... H05K 1/145; H05K 3/303; G01R 33/02
  See application file for complete search history.

(56) References Cited

U.S. PATENT DOCUMENTS

| 2013/0057256 A1 | 3/2013  | Ernst et al.    |
| 2013/0127449 A1 | 5/2013  | Backes          |
| 2013/0255381 A1 | 10/2013 | Fontana et al.  |
| 2014/0159766 A1 | 6/2014  | Fujita et al.   |

FOREIGN PATENT DOCUMENTS

| DE | 102004047770 A1 | 4/2006  |
| DE | 102010028390 A1 | 11/2011 |
| DE | 102011102796 A1 | 11/2012 |
| JP | 2010147048 A    | 7/2010  |
| WO | 2004/048883 A1  | 6/2004  |

*Primary Examiner* — Jeremy C Norris
(74) *Attorney, Agent, or Firm* — Novick, Kim & Lee, PLLC; Jae Youn Kim; Jihun Kim (57) ABSTRACT

A method of positioning a component arranged on a substrate includes providing a substrate having at least one device for sensing an electromagnetic field arranged thereat, generating a dedicated conductive-trace structure on the substrate, the dedicated conductive-trace structure being provided for the purpose of generating an electromagnetic field having a known field distribution, applying an electric voltage to the dedicated conductive-trace structure, so that the dedicated conductive-trace structure generates the electromagnetic field having the known field distribution, and sensing the generated electromagnetic field having the known field distribution by means of the device for sensing an electromagnetic field. According to the method, the location of the component in relation to the substrate is determined on the basis of the above-mentioned sensing of the electromagnetic field having the known field distribution.

17 Claims, 9 Drawing Sheets

METHOD AND DEVICE FOR POSITIONING A COMPONENT ARRANGED ON A SUBSTRATE

CROSS-REFERENCES TO RELATED APPLICATIONS

This application is a continuation of International Application No. PCT/EP2019/066652, filed Jun. 24, 2019, which is incorporated herein by reference in its entirety, and additionally claims priority from German Application No. DE 10 2018 210 735.1, filed Jun. 29, 2018, which is incorporated herein by reference in its entirety.

The invention relates to a method and a device for positioning a component arranged on a substrate, and in particular to a conductive-trace arrangement for positioning magnetic field sensors, capacitive sensors and antennas.

BACKGROUND OF THE INVENTION

When components are soldered onto printed circuit boards, one has to accept inaccuracies with regard to future orientation. This is due both to so-called "floating" when components are soldered on (e.g. upon electrical contacting by means of a ball grid array) and to machine-related tolerances when the printed circuit board is populated with components.

Specifically, with regard to integrated circuits such as sensors, for example, the location of the physical sensor within the semiconductor material (e.g. silicon) as well as within the component package itself is not precisely known and is typically fraught with inaccuracies. This is caused, on the one hand, by sawing the individual dies from a wafer, where there are typically tolerances in terms of the sawing width and the sawing direction. On the other hand, the position of the die when it is inserted into a package is also fraught with inaccuracies.

This results in that in sensor technology applications, neither the exact location nor the vectorial orientation of the quantity to be measured are known and in that, consequently, the measured value may be used as an absolute value only. As soon as relative information such as the distance and the measuring direction are to be derived from the absolute value, this will not be possible without any errors.

In magnetic field sensors, for example, in most cases the printed circuit board serves as a reference surface for the coordinate system in magnetic field measurement. However, the location and orientation of the sensor in relation to the printed circuit board have a considerable influence on the magnetic field to be measured. Specifically in setting up so-called sensor arrays, within which several discrete sensors are to measure the same magnetic field, the locations and orientations of the individual sensors should be known so that they can be taken into account accordingly in the evaluation. This problem also concerns any other sensor technology application in which it is important to know the exact location and position of the measurement.

Nowadays, the position of a component on a printed circuit board may be indicated with the corresponding tolerances for circuit board manufacturing, for manufacturing of the sensor itself (e.g. in case of an integrated circuit), for placement accuracy within the package and for accuracy during population and soldering. This is sufficient for most applications since one either may use only absolute values or since the tolerances mentioned may be compensated for by measuring the system. A typical optical check following population does indeed provide information about the position of the component but not about the position of the sensor within the component and possible tilting thereof within the component.

Further known approaches to solving this problem are based on optically measuring printed circuit boards and their components, whereby the position of the sensor may also be determined. However, this works only with components where the circuit side is visible, which in practice is almost never the case since the circuit is hidden within the package or points toward the printed circuit board due to so-called flip-chip mounting and is not visible.

The sensor position may possibly be found by X-raying the printed circuit board, which involves a large amount of expenditure in a production process, however. The major disadvantage in the solutions mentioned is invariably that the amount of expenditure involved increases as the sensor position is to be determined with increasing precision.

It would therefore be desirable to provide a method of positioning a component on a substrate which may be performed with little expenditure while being able to be used, with high precision and at low cost, in the mass production of electric and electronic components and structural elements. By analogy, the same applies to an inventive device for positioning a component arranged on a substrate.

SUMMARY

According to an embodiment, a method of positioning a component arranged on a substrate may have the steps of: providing a substrate having arranged thereat at least one magnetic field sensor for sensing a static magnetic field and for determining the spatial orientation of the component in relation to the substrate, generating a dedicated conductive-trace structure on the substrate, said dedicated conductive-trace structure being provided for the purpose of generating a static magnetic field having a known field distribution, applying an electric voltage to the dedicated conductive-trace structure, so that the dedicated conductive-trace structure generates the static magnetic field having the known field distribution, sensing the generated static magnetic field having the known field distribution by means of the magnetic field sensor, and determining the spatial orientation of the component in relation to the substrate on the basis of said sensing of the static magnetic field having the known field distribution.

According to another embodiment, a device for positioning a component arranged on a substrate may have: a substrate having arranged thereat at least one magnetic field sensor for sensing a static magnetic field, and for determining the spatial orientation of the component in relation to the substrate, a dedicated conductive-trace structure formed on the substrate, said dedicated conductive-trace structure being provided for the purpose of generating a static magnetic field having a known field distribution, wherein the dedicated conductive-trace structure is configured to generate, upon application of an electric voltage, the static magnetic field having the known field distribution, and an evaluation device configured to sense the generated static magnetic field by means of the magnetic field sensor and to determine the spatial orientation of the component in relation to the substrate on the basis of said sensing of the static magnetic field having the known field distribution.

A first aspect of the invention therefore relates to a method of positioning a component arranged on a substrate by detecting an electromagnetic field. In the inventive method, initially a substrate is provided which has at least one device for sensing an electromagnetic field arranged thereat. The device for sensing an electromagnetic field may itself represent the component, the location of which in relation to the substrate is to be determined. However, it is also conceivable for the device for sensing an electromagnetic field to be built or integrated into a component, in which case the location of said component in relation to the substrate may be determined. This would be feasible, in particular, with integrated circuits. Within this context, for example, the device for sensing an electromagnetic field may be integrated into the semiconductor material of the component, or of the integrated circuit. It is also conceivable for the component, whose location is to be determined, to be arranged within a package; the device for sensing an electromagnetic field may also be arranged within said very package. Moreover, the inventive method comprises a step of producing a dedicated conductive-trace structure on the substrate. Said dedicated conductive-trace structure serves the purpose of producing an electromagnetic field with a known field distribution. This means that one does not arbitrarily generate just any electromagnetic field but one deliberately generates an electromagnetic field whose field distribution is known, for example in that the field distribution is determined by means of model calculations previously performed. The dedicated conductive-trace structure may be provided specifically and exclusively only for generating the electromagnetic field having the known field distribution. However, it is also conceivable for already existing conductive-trace structures to be used for the purpose of generating the electromagnetic field having the known field distribution. An electric voltage is applied to the dedicated conductive-trace structure, so that the dedicated conductive-trace structure generates the electromagnetic field having the known field distribution. This voltage applied to the dedicated conductive-trace structure may be considerably larger than the voltage otherwise used on the substrate, which merely serves to supply the component. For this reason, it is advantageous, as was mentioned above, to provide a dedicated conductive-trace structure provided specifically and exclusively only for generating the electromagnetic field having the known field distribution. The dedicated conductive-trace structure therefore may be provided in addition to the otherwise existing conductive traces serving to supply the component. Since the voltage that may be used for generating the electromagnetic field is higher than the supply voltage for supplying the components with energy, the dedicated conductive-trace structure may have a larger expansion on the substrate than do the conductive traces serving to supply the component. In accordance with the invention, the electromagnetic field generated by means of the dedicated conductive-trace structure may be sensed by means of the device for sensing an electromagnetic field. Since said electromagnetic field has a known field distribution, the location of the device for sensing an electromagnetic field, and, therefore, the location of the component in relation to the dedicated conductive-trace structure, and, thus, in relation to the substrate, may be determined on the basis of said sensing of the electromagnetic field. To this end, the device for sensing an electromagnetic field may be, e.g., an antenna, in particular an antenna having a known radiation characteristic, or a magnetic field sensor, and, in particular, a vectorial-measurement magnetic field sensor, the latter being configured to measure the vectorial field distribution of all three spatial axes. Accordingly, the vectorial orientation of the quantity to be measured, i.e. of the electromagnetic field, may be determined. Thus, by accurately measuring the field vector of the electromagnetic field, one may infer the position of the device for sensing an electromagnetic field in relation to the source of the electromagnetic field, i.e. to the conductive-trace structure. This may be calculated by means of various approaches, such as inverse solution of the Maxwell equations or by modelling the electromagnetic field and optimizing the measured value with regard to this model by means of suitable algorithms. The solution outlined in this invention makes do with simple means and may even be repeated during operation with little additional expenditure.

A second aspect of the invention relates to a device for positioning a component arranged on a substrate by sensing an electromagnetic field. Please refer to the above paragraphs for the advantages of the inventive device as compared to conventional technology.

A third aspect relates to a method of positioning a component arranged on a substrate by sensing an electrostatic field. Within this context, a substrate is initially provided which has at least one capacitive sensor for sensing an electrostatic field arranged thereon. In addition, the substrate has a dedicated conductive-trace structure produced thereon which is provided for the purpose of generating an electrostatic field having a known field distribution. For example, the dedicated conductive-trace structure may comprise at least two conductive traces which are arranged, in relation to each other, such that an electrostatic field is formed between the conductive traces. Alternatively, the dedicated conductive-trace structure may comprise at least one conductive trace, in which case an electrostatic field may form between the conductive trace and the capacitive sensor. Moreover, an electric voltage is applied to the dedicated conductive-trace structure in the inventive method, so that the dedicated conductive-trace structure generates the above-mentioned electrostatic field having the known field distribution. This means that one does not arbitrarily generate just any electrostatic field but one deliberately generates an electrostatic field whose field distribution is known, for example in that the field distribution is determined by means of model calculations previously performed. In accordance with the inventive method, the generated electrostatic field having the known field distribution is sensed by means of the capacitive sensor. Subsequently, the location of the component in relation to the substrate is determined, specifically on the basis of the preceding sensing of the electrostatic field having the known field distribution.

A fourth aspect of the invention relates to a device for positioning a component arranged on a substrate by sensing an electrostatic field. Please refer to the above paragraphs, relating to the third aspect of the invention, for the advantages of the inventive device as compared to conventional technology.

BRIEF DESCRIPTION OF THE DRAWINGS

Embodiments of the present invention will be detailed subsequently referring to the appended drawings, in which.

DETAILED DESCRIPTION OF THE INVENTION

In the following, embodiments will be described in more detail with reference to the figures, and elements having identical or similar functions being provided with the same reference numerals.

Method steps which are depicted in a block diagram and will be explained with reference thereto may also be performed in an order which differs from the one depicted and/or described. In addition, method steps which relate to a specific feature of a device are also interchangeable with said very feature of the device, and this also applies vice versa.

Moreover, magnetic field sensors, in particular vectorial-measurement magnetic field sensors, will be described below as non-limiting examples of a device for sensing an electromagnetic field. Antennas, and in particular directional antennas, or antennas having known radiation characteristics, will be described as further non-limiting examples of a device for sensing an electromagnetic field. Furthermore, magnetic field will be used as a synonym of the term of an electromagnetic field, i.e. the terms electromagnetic field and magnetic field shall be interchangeable in the present application.

Figure 1A:
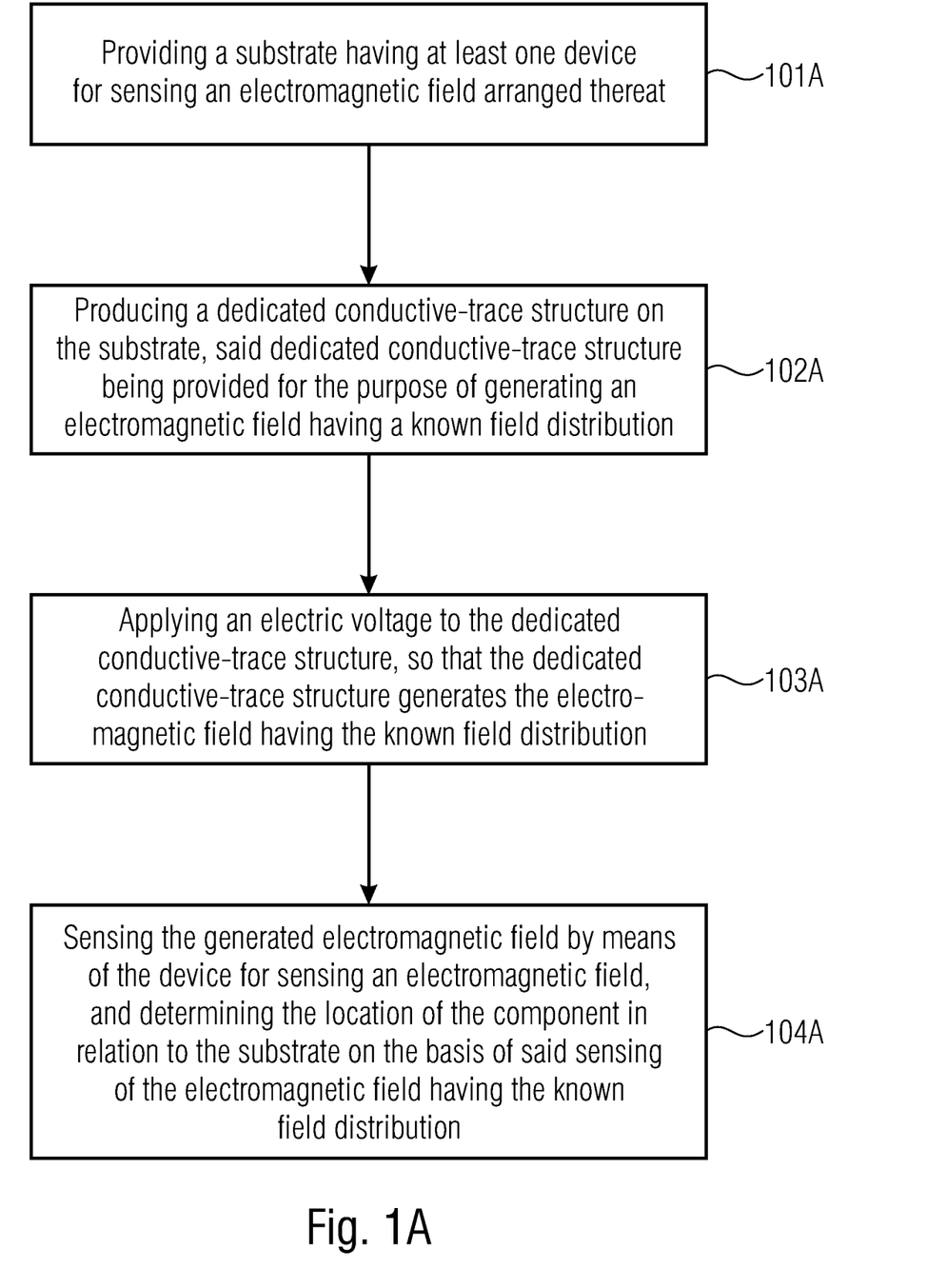
FIG. 1A shows a schematic block diagram for depicting individual process steps of the inventive method in accordance with an embodiment.

FIG. 1A shows a block diagram for depicting the inventive method in accordance with an embodiment.

In block 101A, a substrate having at least one device for sensing an electromagnetic field arranged thereat is provided.

In block 102A, a dedicated conductive-trace structure is produced on the substrate, the dedicated conductive-trace structure being provided for the purpose of generating an electromagnetic field having a known field distribution.

In block 103A, an electric voltage is applied to the dedicated conductive-trace structure, so that the dedicated conductive-trace structure generates the electromagnetic field having the known field distribution.

In block 104A, the electromagnetic field that has been generated is sensed by means of the device for sensing an electromagnetic field, and the location of the component in relation to the substrate is determined on the basis of said sensing of the electromagnetic field having the known field distribution.

As was already mentioned at the outset, the device for sensing an electromagnetic field itself may represent the component whose location in relation to the substrate is to be determined. Alternatively, the device for sensing an electromagnetic field may be integrated into a component whose location in relation to the substrate is to be determined. Alternatively, the device for sensing an electromagnetic field may be arranged at a component whose location in relation to the substrate is to be determined.

The method may further comprise a step of determining the field distribution of the electromagnetic field generated by means of the dedicated conductive-trace structure. Thus, the field distribution of the electromagnetic field that has been generated is subsequently known, and the electromagnetic field thus becomes an electromagnetic field having a known field distribution. Determining the field distribution is advantageously performed prior to determining the location of the component.

Figure 1B:
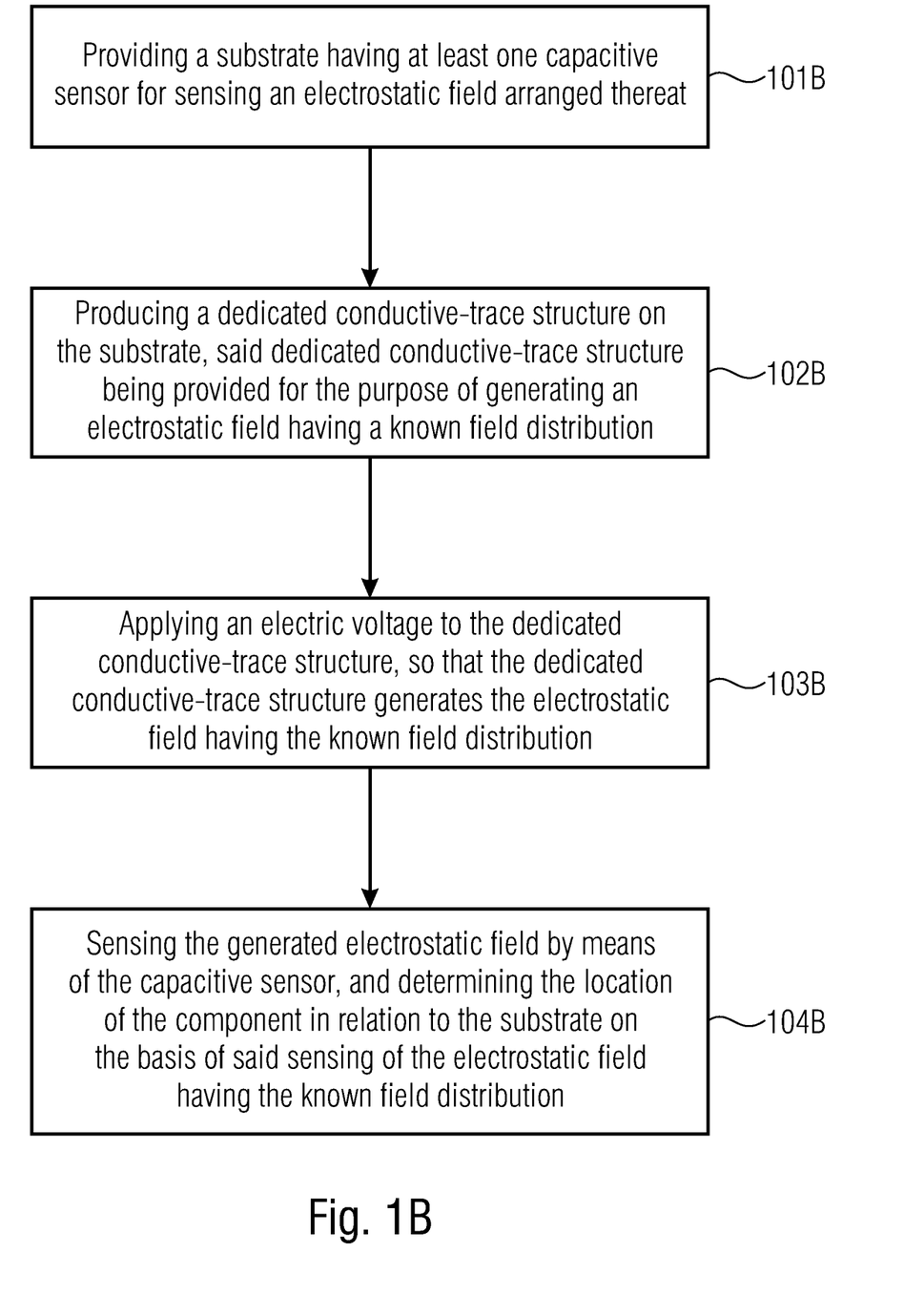
FIG. 1B shows a schematic block diagram for depicting individual process steps of the inventive method in accordance with a further embodiment.

FIG. 1B shows a block diagram for depicting the inventive method in accordance with a further embodiment. Instead of an electromagnetic field as described in FIG. 1A, an electrostatic field is generated here in FIG. 1B.

In block 101B, a substrate is provided which has at least one capacitive sensor for sensing an electrostatic field arranged thereat.

In block 102B, a dedicated conductive-trace structure is produced on the substrate, said dedicated conductive-trace structure being provided for the purpose of generating an electrostatic field having a known field distribution.

In block 103B, an electric voltage is applied to the dedicated conductive-trace structure, so that the dedicated conductive-trace structure generates the electrostatic field having the known field distribution.

In block 104B, the electrostatic field that has been generated is sensed by means of the capacitive sensor, and the location of the component in relation to the substrate is determined on the basis of said sensing of the electrostatic field having the known field distribution.

As was already mentioned at the outset, the capacitive sensor itself may represent the component whose location in relation to the substrate is to be determined. Alternatively, the capacitive sensor may be integrated into a component whose location in relation to the substrate is to be determined. Alternatively, the capacitive sensor may be arranged at a component whose location in relation to the substrate is to be determined.

The method may further comprise a step of determining the field distribution of the electrostatic field generated between the dedicated conductive-trace structure. Thus, the field distribution of the electrostatic field that has been generated is subsequently known, and the electrostatic field thus becomes an electrostatic field having a known field distribution. Determining the field distribution is advantageously performed prior to determining the location of the component.

Figure 2:
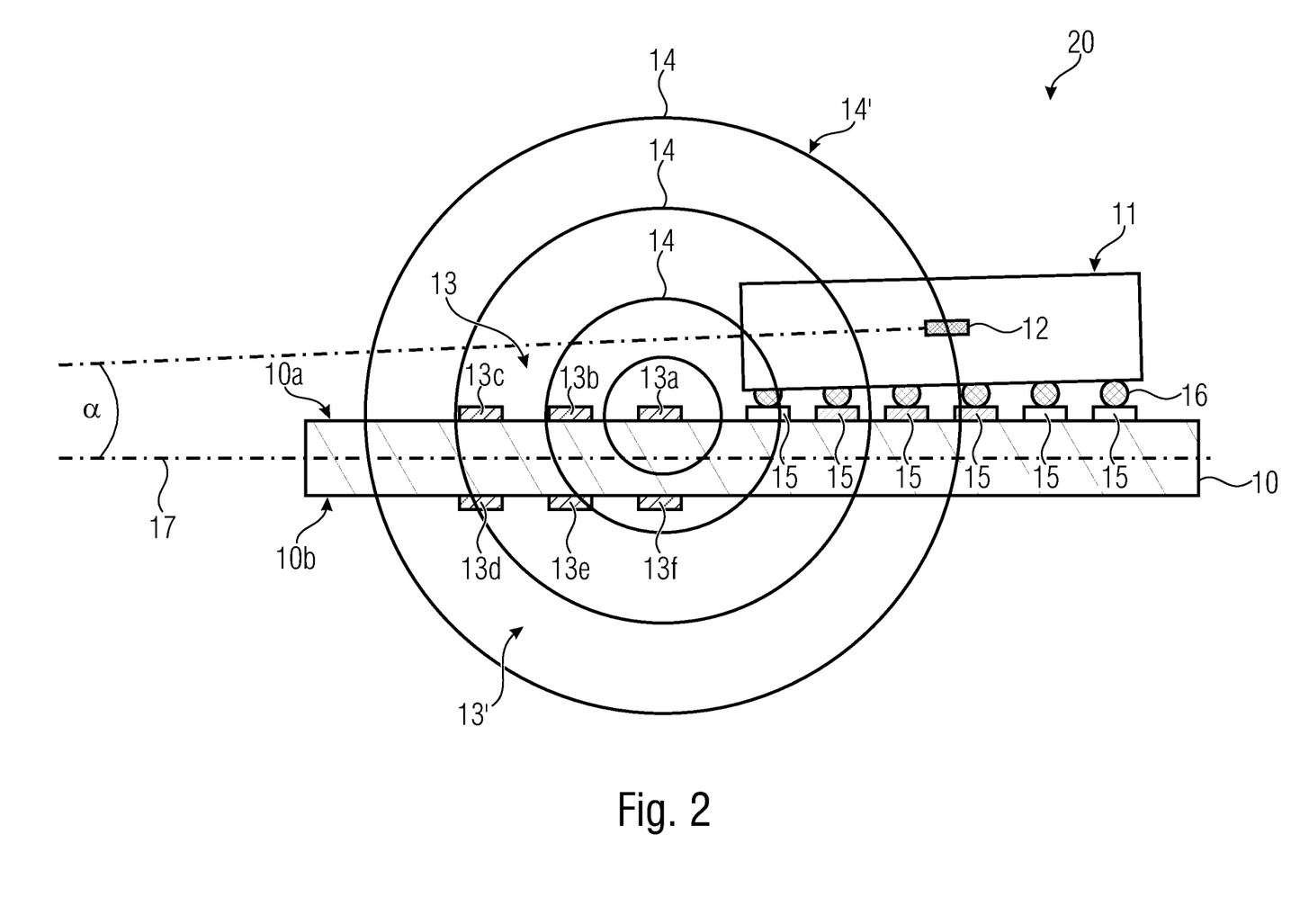
FIG. 2 shows a lateral representation of an inventive device in accordance with an embodiment.

FIG. 2 shows a schematic lateral view of an inventive device 20 in accordance with an embodiment, by means of which also the inventive method is to be described in more detail below.

The device 20 comprises a substrate 10. The substrate 10 has a component 11 arranged thereon whose location in relation to the substrate 10 may be determined by means of the inventive method. Said component 11 may be, e.g., an integrated circuit comprising a device 12 for sensing an electromagnetic field.

The device 12 for sensing an electromagnetic field may be an antenna, for example. Advantageously, said antenna may be an antenna having a known radiation characteristic.

Alternatively, the device 12 for sensing an electromagnetic field may be a magnetic field sensor, and in particular a vectorial magnetic field sensor. In the following, the device 12 for sensing an electromagnetic field will be described by using the example of such a magnetic field sensor, and any explanations given shall equally apply to antennas.

As mentioned above, the component 11, whose location is to be determined, may comprise, e.g., an integrated circuit, which integrated circuit in turn may comprise a magnetic field sensor 12. Accordingly, the component 11 itself may be the magnetic field sensor 12 whose location in relation to the substrate 10 may be determined by means of the inventive method.

The substrate 10 may be, for example, a printed circuit board, which may also be referred to as PCB. The substrate 10 may have one or more conductive traces 15 located thereon which are provided for supplying one or more components arranged on the substrate 10 with energy.

In accordance with the invention, a dedicated conductive-trace structure 13 is provided on the substrate 10. The dedicated conductive-trace structure 13 may comprise several conductive traces 13a-13f, as is shown here by way of example. The dedicated conductive-trace structure 13 may also comprise merely one single conductive trace 13a, however. For clarity's sake, the inventive device 20 and the inventive method will be explained below by using the example of one single conductive trace 13a; any related explanations shall equally apply to any optionally existing additional conductive traces 13b-13f of the conductive-trace structure 13.

As can also be seen in FIG. 2, the conductive-trace structure 13 may be arranged on the same side 10a of the substrate 10 as the magnetic field sensor 12. In the present embodiment, this applies to the upper conductive-trace structure 13 depicted in FIG. 2, which may comprise the conductive traces 13a, 13b, 13c. Alternatively or additionally, the conductive-trace structure 13, or a further conductive-trace structure, may be arranged on that side 10b of the substrate 10 which is located opposite the magnetic field sensor 12. In the present embodiment, this applies to the lower conductive-trace structure 13' depicted in FIG. 2, which may comprise the conductive traces 13d, 13e, 13f.

Further embodiments (which are not explicitly shown here) provide for the step of generating the dedicated conductive-trace structure 13 on the substrate 10 to include the fact that the dedicated conductive-trace structure 13 is configured as a buried conductive-trace structure integrated into the substrate 10. This means that the conductive-trace structure 13 may comprise one or more conductive traces 13a-13f, at least one of which is integrated into the substrate 10, for example in the form of a buried conductive trace. In addition, the method might also be implemented with printed conductive traces (2D and 3D).

The component 11 depicted here by way of example, or the magnetic field sensor 12 mentioned by way of example, is arranged at, or connected to, the conductive traces 15 serving to supply the component. One possibility of this are the solder balls 16 which are depicted here by way of example only. As can be seen, tilting of the component 11, or of the magnetic field sensor 12, may occur as the component 11 is arranged on the conductive traces 15. In this example, the magnetic field sensor 12 is tilted, for example, by an angle α as compared to the substrate plane 17. This may be due to so-called "floating" during soldering of the component 11, or of the magnetic field sensor 12 (e.g. during electrical contacting by means of a ball grid array) and to machine-related tolerances which occur when the substrate 10 is populated.

Alternatively or additionally, further tilts (not explicitly depicted here) of the magnetic field sensor 12 in relation to the substrate 10, for example during integration of the magnetic field sensor 12 into the semiconductor material thereof, may occur. Moreover, in addition to a tilt, further changes in location in relation to the substrate 10 may occur while the magnetic field sensor 12 is arranged, for example a twist in relation to the substrate plane 17, as may be seen by way of example in the top view shown in FIG. 3. Here, the magnetic field sensor 12 is twisted, alternatively or additionally to the tilt by the angle α, by a rotational angle β in relation to the substrate plane 17.

Generally, spatial orientation and/or the position of the magnetic field sensor 12, and, thus, of the component 11, in relation to the substrate 10 may be determined, in all three spatial directions, by means of the inventive method and/or the inventive device 20.

Figure 3:
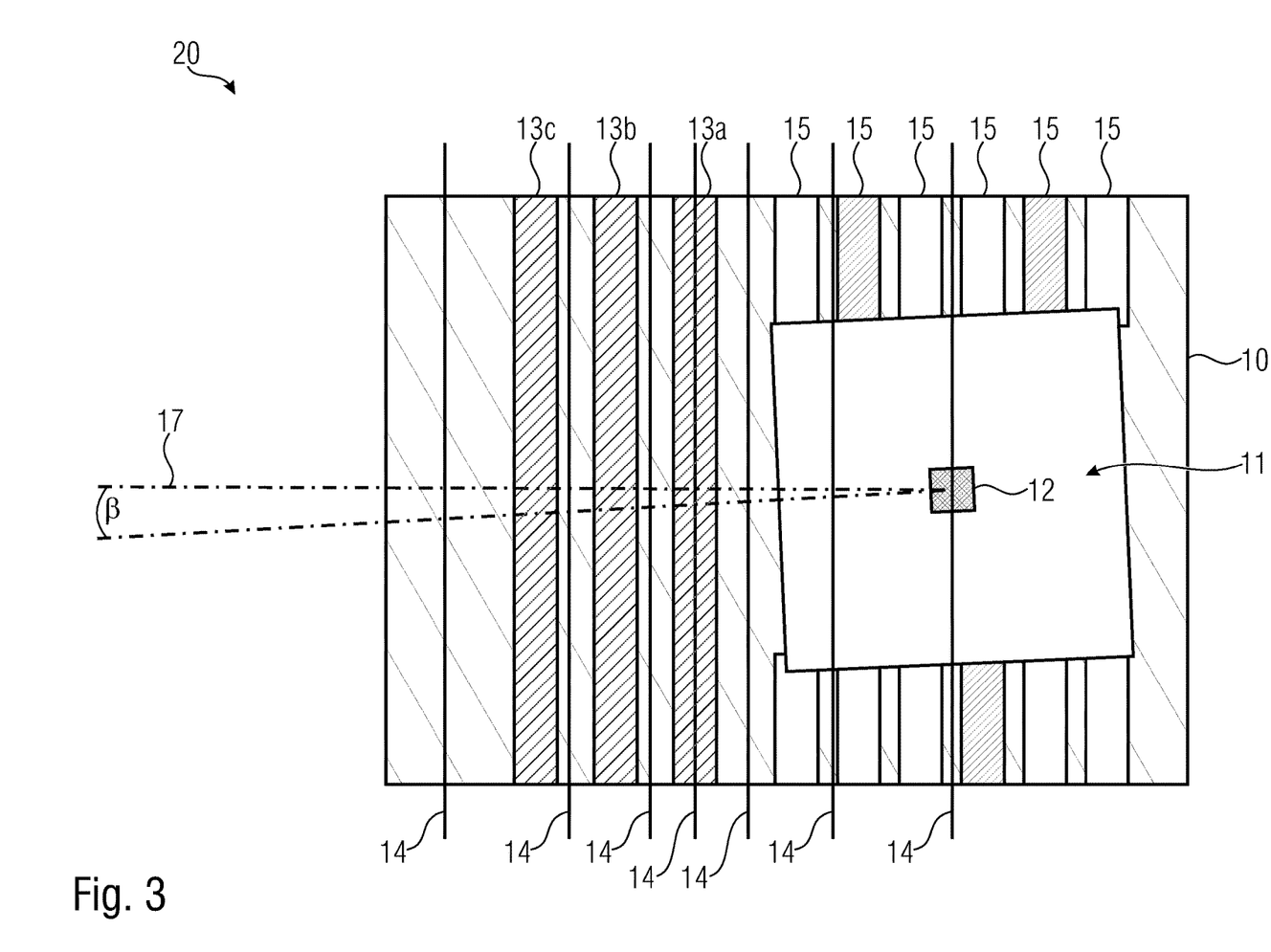
FIG. 3 shows a top view of the inventive device of FIG. 2.

To this end, in accordance with the invention, an electric voltage may be applied to the dedicated conductive-trace structure 13 mentioned at the outset, so that a corresponding current flows through the conductive-trace structure 13, which current in turn generates a magnetic field 14'. In FIGS. 2 and 3, several field lines 14 are schematically drawn in which represent the magnetic field 14' generated by the dedicated conductive-trace structure 13.

If the device 12 for sensing an electromagnetic field is configured as an antenna, a high-frequency AC voltage may be applied to the conductive-trace structure 13, so that an alternating current flows through the conductive-trace structure 13, which in turn generates an electromagnetic alternating field 14', from which electromagnetic free-space waves may become detached, which in turn may be sensed and/or received by means of the antenna 12. Therefore, the conductive-trace structure 13 would represent a transmit antenna, and the device 12 for sensing an electromagnetic field would therefore represent a receive antenna.

If the device 12 for sensing an electromagnetic field is configured as a magnetic field sensor, a DC voltage or a sufficiently low-frequency AC voltage may be applied to the conductive-trace structure 13, so that a static, or quasi-static, electromagnetic field is generated which in turn may be sensed by means of the magnetic field sensor 12.

In the present embodiments, the dedicated conductive-trace structure 13 may be configured such that at least one conductive trace 13a is configured as a straight line. Here, the at least one conductive trace 13a may be configured as a straight line at least in one portion in which the conductive trace 13a laterally runs past the magnetic field sensor 12. However, it is also feasible for the at least one conductive trace 13a to extend in the form of a straight line across the entire substrate 10.

Such a conductive trace 13a configured as a straight line generates a magnetic field 14' having a homogenous field distribution. This means that the field distribution arising in this case is known, or may be determined by simple means. The magnetic field lines 14 here may propagate concentrically around the straight conductive trace 13a as equipotential lines.

Alternatively or additionally, it is also feasible for the dedicated conductive-trace structure 13 to be configured as a coil structure having at least two conductive traces arranged in parallel with each other.

Irrespective of the specific geometric configuration of the dedicated conductive-trace structure 13 it is advantageous for the dedicated conductive-trace structure 13 to extend along the magnetic field sensor 12 at as small a distance from the latter as possible. In accordance with embodiments, it is feasible for the dedicated conductive-trace structure 13 to comprise only a small spacing, within the range of several millimeters, from the magnetic field sensor 12 and/or from the component 11. Advantageously, the dedicated conductive-trace structure 13 extends directly and/or immediately next to and along the component 11, i.e. without any conductive traces or other structures and/or components arranged therebetween.

Because of the geometrical vicinity between the dedicated conductive-trace structure 13 and the magnetic field sensor 12, it may be sufficient to apply only a small voltage of a few volt to the dedicated conductive-trace structure 13 so as to generate a magnetic field 14' of a correspondingly small quantity, which is strong enough to perform the inventive method, however.

In order to determine the location of the magnetic field sensor 12 within the space, or in relation to the substrate 10, it is advantageous for the magnetic field sensor 12 to be pre-calibrated with sufficient accuracy and to have as small a measurement error as possible. "Calibrated" within this context means that the measurement errors of the magnetic field sensor 12 are sufficiently known and may therefore be compensated for.

The magnetic field sensor 12 advantageously is a so-called vectorial-measurement magnetic field sensor configured to determine the orientation of the field vector of a magnetic field line to be measured.

By accurately measuring the field vector of the electromagnetic field 14' generated by means of the dedicated conductive-trace structure 13, one may thus infer the location of the magnetic field sensor 12 in relation to the magnetic field source, i.e. in relation to the dedicated conductive-trace structure 13. Within this context, it is advantageous for the shape of the generated magnetic field 14' to be very well known in order to allow a conclusion to be drawn. This may be calculated by means of various approaches, such as, e.g., an inverse solution of the Biot-Savart law or of the Maxwell equations, or via modelling of the magnetic field 14' and optimizing the measured value with regard to this model by means of suitable algorithms.

Thus, in accordance with the invention, the magnetic field sensor 12 may be used to perform a measurement of the magnetic field 14' generated and to determine the spatial position of the magnetic field sensor 12 in relation to the substrate, specifically on the basis of the preceding measurement of the magnetic field 14', whose field distribution is known.

The same also applies if instead of a magnetic field sensor, an antenna is used as the device 12 for sensing an electromagnetic field. Here, too, one may infer the location of the antenna 12 and, thus, of the component 11, in relation to the substrate 10 on the basis of the field distribution measured since the field distribution 14 of the electromagnetic field 14' is known in accordance with the invention.

The electromagnetic field 14' may advantageously be generated by means of the dedicated conductive-trace structure 13. The dedicated conductive-trace structure 13 may be provided exclusively for the purpose of generating the electromagnetic field 14'—which is used for determining the location of the device 12 for sensing the electromagnetic field and, thus, of the component 11, in relation to the substrate 10—on the substrate 10. In this case, the dedicated conductive-trace structure 13 would not serve to supply the components arranged on the substrate 10 with energy.

Alternatively or additionally, a voltage may be applied to the one or more conductive traces 15, which are actually provided for supplying components arranged on the substrate 10 with energy, in order to generate an electromagnetic field 14' for determining the location of the magnetic field sensor 12, and/or of the component 11, in relation to the substrate 10. However, since the conductive traces 15 provided for the purpose of supplying energy typically have a very unsteady and sometimes complicated course on the substrate 10, the field distribution is difficult to determine in most cases. Provision of the dedicated conductive-trace structure 13 may therefore be advantageous as compared to using already existing conductive traces 15 for the purpose of supplying energy.

Apart from that, the conductive traces 15 provided for supplying energy may have no sufficiently high voltage applied thereto, in most cases, so as to generate an electromagnetic field that is sufficiently strong to perform the inventive method. For example, with many electric or electronic circuits, no more than 6 volt are applied to the conductive traces 15 provided for supplying energy so as not do damage the components connected thereto. Accordingly, the dimensions of the conductive traces 15 provided for supplying energy are not adapted to accommodate considerably larger voltages and currents.

The one or more conductive traces 13a-13f of the dedicated conductive-trace structure 13, in contrast, may have, e.g., larger widths than the conductive traces 15 provided for supplying energy, so as thus to be able to conduct larger currents and, accordingly, to generate a stronger electromagnetic field.

The dedicated conductive-trace structure 13, for example, may be structured into the substrate 10 by means of common structuring methods. For example, the dedicated conductive-trace structure 13 may be structured into the substrate 10 by means of a photolithography method. An advantage of the invention within this context consists in that in particular photolithography methods allow a very high level of precision in producing the dedicated conductive-trace structure 13. This is particularly beneficial for determining the field distribution of the electromagnetic field 14' which may be generated by means of the dedicated conductive-trace structure 13. Due to the high level of precision in the production of the dedicated conductive-trace structure 13, specifically, the field distribution may turn out to be easily traceable and/or very homogenous, so that positioning of the magnetic field sensor 12, or of the component 11, on the basis of the field distribution of the electromagnetic field 14' also becomes very accurate.

In other words, therefore, it is because of the manner of producing, e.g., printed circuit boards by means of optical exposure that a very high level of manufacturing accuracy may be achieved which will meet the requirements placed upon the knowledge of the shape of the electromagnetic field 14'.

In accordance with a further feasible embodiment, differential measurement of two electromagnetic fields having different field strengths may be performed so as to determine and compensate for, e.g., interference fields, in particular static interference fields such as the Earth's magnetic field. In this case, the location of the component 11 is determined on the basis of the differential value.

In accordance with such an embodiment, the step of applying the electric voltage may include applying an electric voltage having a first amount of voltage ($1^{st}$ amplitude) in a first step, so that the dedicated conductive-trace structure 13 generates the electromagnetic field 14' having the known field distribution 14. The electromagnetic field 14' which has been generated and has the known field distribution 14 may then be sensed by means of the device 12 for sensing an electromagnetic field 14'. A subsequent second step may include applying an electric voltage having a second amount of voltage ($2^{nd}$ amplitude), so that the dedicated conductive-trace structure 13 generates a second electromagnetic field having a field distribution which is also known. The first and second amounts of voltage, i.e. the first and second amplitudes, are to differ from each other within this context. The second electromagnetic field that has been generated may then also be sensed by means of the device 12 for sensing an electromagnetic field 14'. Subsequently, a difference between the field strength of the first electromagnetic field 14' and the field strength of the second electromagnetic field may be determined. Eventually, the location of the component 11 in relation to the substrate 10 may be determined, specifically on the basis of the difference between the electromagnetic field 14' and the second electromagnetic field.

Instead of generating the second electromagnetic field by means of the dedicated conductive-trace structure 13, it is also possible to provide a second conductive-trace structure 13' by means of which the second electromagnetic field may be generated.

In such an embodiment, the inventive method might comprise a step of producing at least one second dedicated conductive-trace structure 13' on the substrate 10 for the purpose of generating a second electromagnetic field having a known field distribution. The second electromagnetic field that has been generated may be sensed by means of the device 12 for sensing an electromagnetic field. The location of the component 11 in relation to the substrate 10 may then be determined on the basis of said sensing of the electromagnetic field 14' having the known field distribution 14 and of said sensing of the second electromagnetic field having the known field distribution. Here, too, differential measurements of the respective field strengths of the two electromagnetic fields may be performed.

It may also be conceivable to change the polarity of the electric voltage at least once. This means that the voltage is applied in a reciprocal manner at least once, so that the current flows in the opposite direction at least once and will generate, in addition to the electromagnetic field 14' having the known field distribution 14, an oppositely directed electromagnetic field having a known field distribution. Also, within this context, differential measurements of the field strengths of the two electromagnetic fields may be performed.

In accordance with such an embodiment, the step of applying the electric voltage to the dedicated conductive-trace structure 13 may include applying the voltage in a reciprocal manner at least once, so that the current flows in the opposite direction at least once and will generate an oppositely directed electromagnetic field having a known field distribution. The oppositely directed electromagnetic field that has been generated may be sensed by means of the device 12 for sensing an electromagnetic field 14', and a difference between the electromagnetic field 14' that has been generated and the oppositely directed electromagnetic field that has been generated may be determined.

In other words, it is by means of the device 12 for sensing the electromagnetic field that the oppositely directed electromagnetic field which has been generated may be measured, and subsequently, a difference between the electromagnetic field 14' that has been generated and the oppositely directed electromagnetic field that has been generated may be determined; it is on the basis of this difference that the location of the component 11 in relation to the substrate 10 may be determined.

The oppositely directed electromagnetic field may be generated, within this context, either by means of the same dedicated conductive-trace structure 13 with which the first electromagnetic field 14' having the known field distribution is also generated, or may be generated with a further additional dedicated conductive-trace structure 13'.

On the basis of the above-mentioned examples of differential measurements it becomes possible to determine and to compensate for interference fields, in particular homogenous interference fields such as, for example, the Earth's magnetic field.

Polarity reversal is not mandatory within this context. However, it is to be noted that the differential signal is processed further. In alternating fields, there will typically be one alternating field, and said condition is therefore met.

Figure 4:
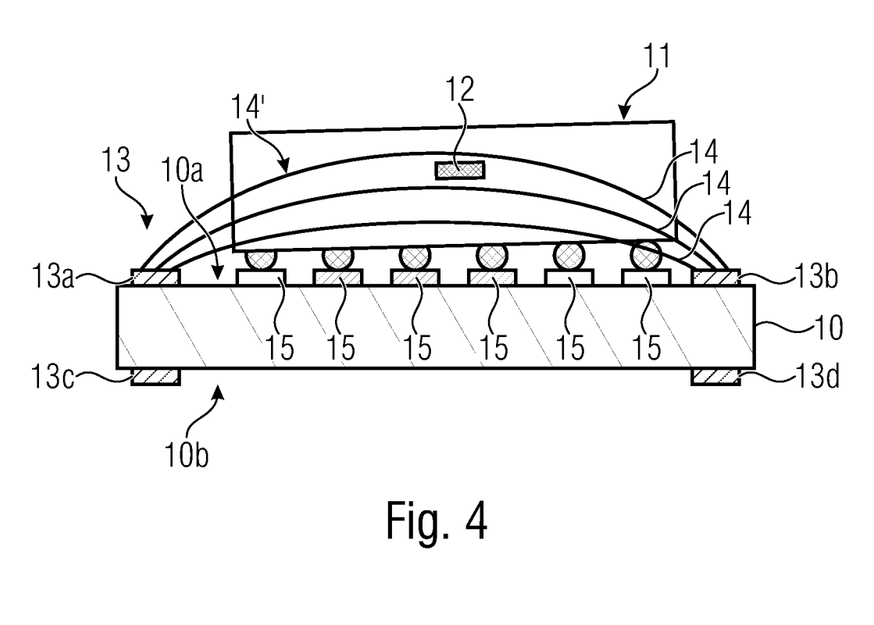
FIG. 4 shows a lateral representation of an inventive device in accordance with a further embodiment.
Figure 5:
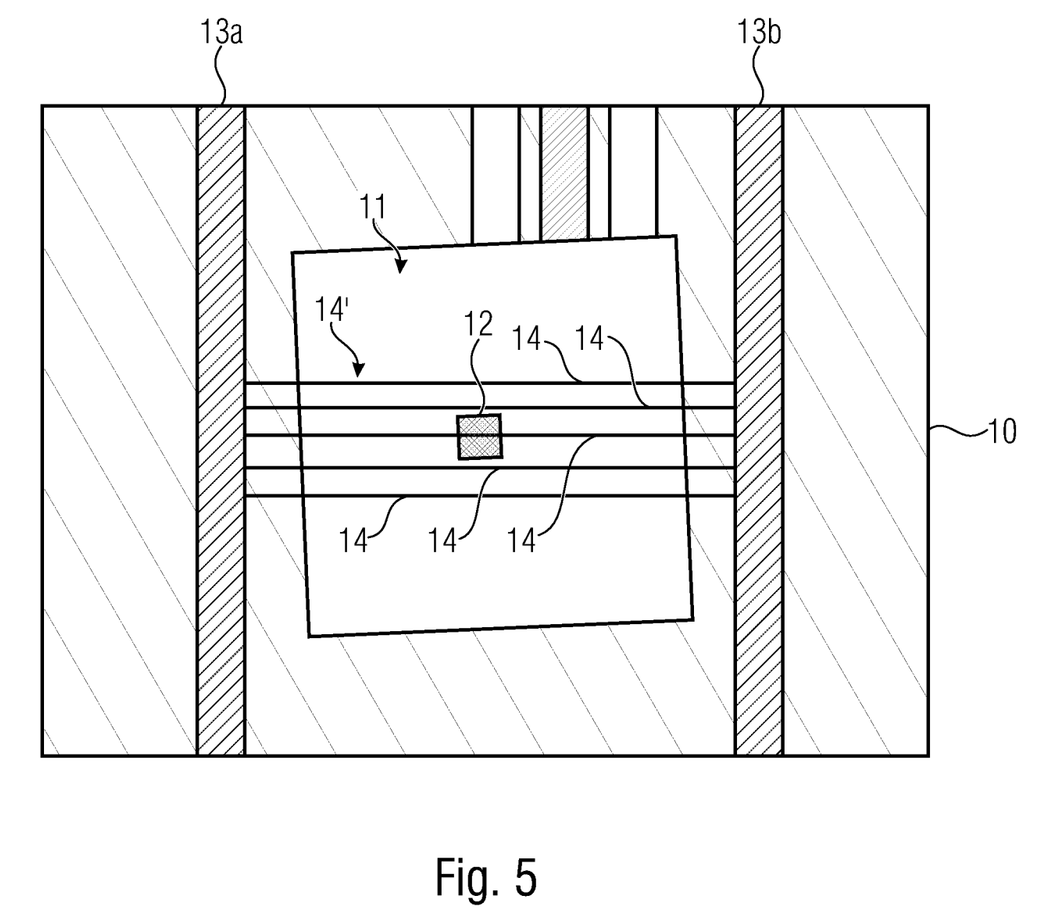
FIG. 5 shows a top view of the inventive device of FIG. 4.

FIGS. 4 and 5 show a further embodiment of a device for positioning a component 11 arranged on a substrate 10. However, positioning here is not performed by means of an electromagnetic field but by means of an electrostatic field. Also, by means of FIGS. 4 and 5, the inventive method of positioning a component 11 arranged on a substrate 10 by means of an electrostatic field is described.

This embodiment essentially corresponds to the embodiment discussed with reference to FIGS. 2 and 3, which is why elements having identical functions are provided with identical reference numerals. However, instead of an electromagnetic field, an electrostatic field will be considered, and instead of the device 12 for sensing an electromagnetic field, a capacitive sensor 12 is provided.

The substrate 10 has a component 11 arranged thereat whose location in relation to the substrate 10 is to be determined. The component 11 may have a capacitive sensor 12 integrated therein, so that the capacitive sensor 12 itself represents the component 11 whose location is to be determined. Alternatively, the capacitive sensor 12 may be arranged at the component 11, or may be arranged within a package along with the component 11. Then one may infer the location of the component 11 in relation to the substrate 10 on the basis of positioning of the capacitive sensor 12.

The substrate 10 further has a dedicated conductive-trace structure 13 provided thereon. The dedicated conductive-trace structure 13 in this non-limiting example comprises two conductive traces 13*a*, 13*b* which are arranged in relation to each other such that upon application of an electric voltage, an electrostatic field 14 will form between the at least two conductive traces 13*a*, 13*b*.

Alternatively, the dedicated conductive-trace structure 13 may comprise merely one conductive trace 13*a*, in which case an electrostatic field may form between this one conductive trace 13*a* and the capacitive sensor 12.

At least one of the two conductive traces 13*a*, 13*b* depicted by way of example may be arranged on the same side 10*a* of the substrate 10 as the component 11 whose location in relation to the substrate 10 is to be determined. Alternatively or additionally, at least one further conductive trace 13*c*, 13*d* may be arranged on that side 10*b* of the substrate 10 which is located opposite the component 11.

Upon application of an electric voltage, an electrostatic field 14' will form between the two conductive traces 13*a*, 13*b*. The electrostatic field 14' comprises several field lines 14, which together represent the field distribution of the electrostatic field 14'.

Advantageously, the component 11 spatially is arranged between the at least two conductive traces 13*a*, 13*b*. Thus, the field lines 14 at least partially extend through the component 11, and, in particular, through the capacitive sensor 12. Since the field distribution of the electrostatic field 14' is known, this may form as a basis for inferring the spatial location of the component 11, or of the capacitive sensor 12, in relation to the substrate 10.

Figure 6:
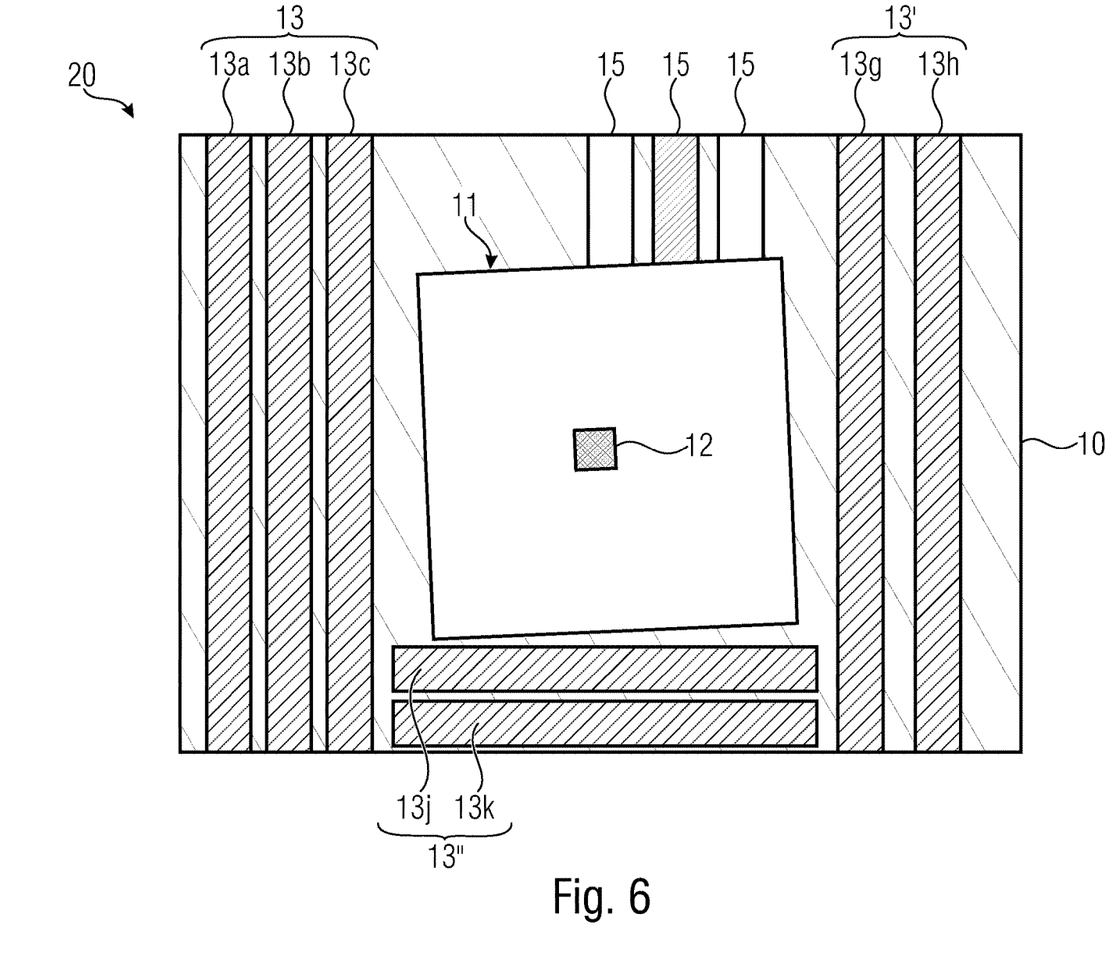
FIG. 6 shows a top view of an inventive device in accordance with a further embodiment.

FIG. 6 shows a further feasible embodiment which applies both to electromagnetic fields and to electrostatic fields, and, thus, to devices 12 for sensing electromagnetic fields as well as to capacitive sensors 12.

As can be seen in FIG. 6, further dedicated conductive-trace structures 13 may be provided on the substrate 10. More specifically, the substrate 10 has the above-described dedicated conductive-trace structure 13 arranged thereon which comprises at least one conductive trace 13a, 13b, 13c. In addition, the substrate 10 may have at least one further dedicated conductive-trace structure 13' arranged thereon which also comprises at least one conductive trace 13g, 13h. Furthermore, the substrate 10 may have a further dedicated conductive-trace structure 13" provided thereon, which for its part comprises at least one conductive trace 13j, 13k.

As may also be seen in FIG. 6, the at least one further dedicated conductive-trace structure 13' may be arranged, e.g., on a side of the device 12, or of the capacitive sensor 12, which is located opposite the first dedicated conductive-trace structure 13. Alternatively or additionally, the at least one further dedicated conductive-trace structure 13" may be arranged along a different (in comparison to the first dedicated conductive-trace structure 13) side of the device 12, or of the capacitive sensor 12.

As can also be seen in FIG. 6, the at least one further dedicated conductive-trace structure 13' may comprise at least one conductive trace 13g, 13h, which extends in parallel with the at least one conductive trace 13a, 13b, 13c of the first dedicated conductive-trace structure 13. Alternatively or additionally, the at least one further dedicated conductive-trace structure 13" may comprise at least one conductive trace 13j, 13k, which extends in an oblique, and in particular orthogonal, manner in relation to the at least one conductive trace 13a, 13b, 13c of the first dedicated conductive-trace structure 13.

This at least one further dedicated conductive-trace structure 13', 13" may also have a voltage applied to it, so that the current flowing through the conductive traces 13g, 13h, 13j, 13k of the at least one further dedicated conductive-trace structure 13', 13" generates at least one further electromagnetic and/or electrostatic field. Advantageously, the field distribution of the at least one further electromagnetic and/or electrostatic field is also known.

In accordance with this embodiment, therefore, several conductive-trace structures 13, 13', 13" may be used for generating different electromagnetic and/or electrostatic fields, so as to determine, e.g., several degrees of freedom of the location of the component 11.

Correctly performed, such multiple measurement also enables measuring both the thicknesses and the expansions of the conductive-trace structures 13, 13', 13" on the printed circuit board 10, which allows these further manufacturing tolerances to be taken into account.

Figure 7:
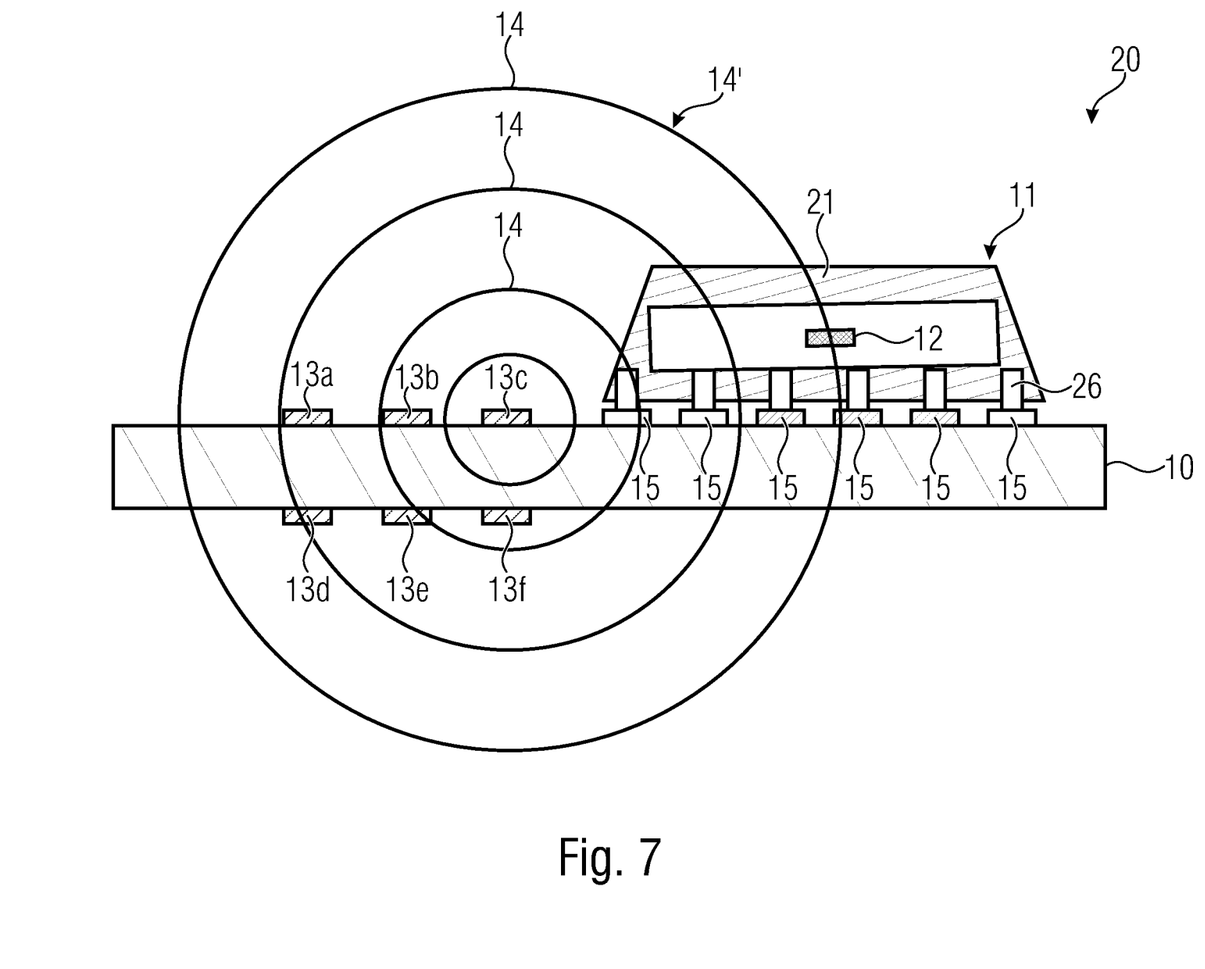
FIG. 7 shows a lateral representation of an inventive device in accordance with a further embodiment.

FIG. 7 shows a further embodiment of an inventive device 20. This embodiment essentially corresponds to the embodiments discussed with reference to FIGS. 2 to 6, which is why elements having identical functions are provided with identical reference numerals. However, this embodiment shown in FIG. 7 differs from the embodiments shown in FIGS. 2 to 6 in that, among other things, the device 12, mentioned at the outset, for sensing an electromagnetic field, or the capacitive sensor 12, is arranged within one package 21 together with the component 11.

It is only by way of example that a magnetic field sensor 12 will be described below as an example of a device 12 for sensing an electromagnetic field. However, the description which follows equally applies to an electrostatic field and to a capacitive sensor 12 for sensing the electrostatic field.

As can be seen in FIG. 7, the magnetic field sensor 12 here may be arranged, or integrated, within the component 11 whose location in relation to the substrate 10 is to be determined with the aid of the magnetic field sensor 12. Said component 11, in turn, may be arranged within a package 21.

By means of the inventive concept, the location of the device 12, or of the capacitive sensor 12, and, therefore, of the component 11 in relation to the conductive-trace structure 13 and in relation to the substrate 10 may be determined. This may be performed even if the component 11 might be arranged to be tilted, or twisted, within a package 21. This means, it is only of minor importance how the package 21 itself is arranged in relation to the substrate 10, since it is typically only the relative location of the component 11 in relation to the substrate 10 that is of interest.

In addition, FIG. 7 here shows a further possibility of fastening the component 11 to the substrate 10. Pins 26 are shown here instead of the above-mentioned solder balls 16. Arranging the component 11 on the substrate 10 by means of pins 26 may also result in the above-mentioned tilts and/or twists of the component 11 in relation to the substrate 10.

As can be seen in FIG. 7, e.g. the magnetic field sensor 12 may be tilted within the package 21. This means, even though the package 21 rests upon the substrate 10 in a centered manner, the magnetic field sensor 12 is tilted also in relation to the substrate 10 because of its tilt within the package 21, which may result in imprecise measurements. Since the package 21 typically is opaque, the tilted orientation of the magnetic field sensor 12 inside the package 21 cannot be detected by optical means. However, with the inventive device 20, and/or with the inventive method, it is possible to ascertain said tilting in a simple manner.

Figure 8:
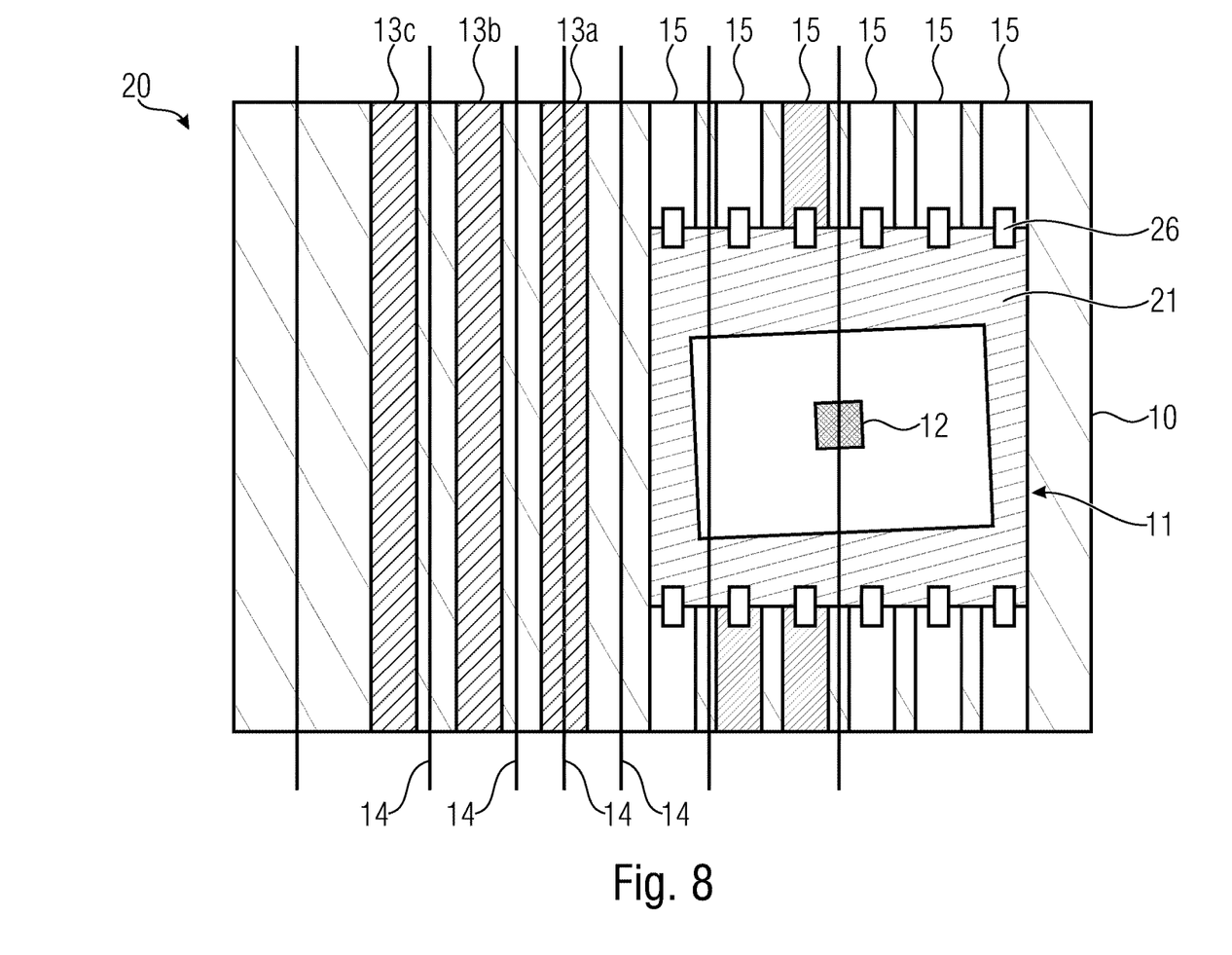
FIG. 8 shows a top view of the inventive device of FIG. 7.

FIG. 8 shows a top view of the embodiment having a chip package 21. This embodiment essentially corresponds to the embodiments discussed with reference to FIGS. 3 and 5, which is why elements having identical functions are provided with identical reference numerals.

Here, too, one can see that the magnetic field sensor 12 may be twisted inside the package 21. This means, even though the package 21 rests upon the substrate 10 in a centered manner, the magnetic field sensor 12 is twisted also in relation to the substrate 10 because of its twist within the package 21, which may result in imprecise measurements. Since the package 21 typically is opaque, the twisted orientation of the magnetic field sensor 12 inside the package 21 cannot be detected by optical means. However, with the inventive device 20, and/or with the inventive method, it is possible to ascertain said twist in a simple manner.

For the further functional and structural descriptions of the embodiment shown in FIGS. 7 and 8, please refer to the above discussions on the embodiments shown in FIGS. 2 to 6.

Therefore, by means of the inventive method, the positions of the magnetic field sensors 12 in relation to the conductive-trace structures 13, 13', 13" and, thus, in relation to the printed circuit board, i.e. to the substrate 10, itself may be reconstructed by using sufficiently calibrated magnetic field sensors 12. The location of the printed circuit board, and/or of the substrate 10, in a subsequent application may then be referenced optically or mechanically. This measurement principle may also be applied in an electrostatic or electromagnetic manner if one uses suitable capacitive sensors or antennas instead of magnetic field sensors 12.

In the following, the invention is to be summarized once again in other words: instead of the magnetic field sensor 12 mentioned by way of example, it is also possible to provide an antenna or a capacitive sensor, and instead of the electromagnetic field (or the magnetic field), an electrostatic field may be provided:

In order to be able to determine the position of a component 11, such as of a magnetic field sensor 12, for example, within the space by means of the inventive method, it is advantageous for inventive magnetic field sensors 12 to be calibrated with sufficient accuracy and to have as little a measuring error as possible. Thus, by accurately measuring the field vector of an externally applied magnetic field 14', one may infer the position of the magnetic field sensor 12 in relation to the magnetic field source (dedicated conductive-trace structure 13, 13', 13").

Within this context, it is advantageous for the shape of the magnetic field 14' that has been generated to be known with a high level of accuracy in order to allow a conclusion to be drawn. This may be calculated via various approaches, such as, e.g., an inverse solution of the Biot-Savart law or via modelling the magnetic field 14' and optimizing the measured value with regard to this model by means of suitable algorithms.

The magnetic field 14' for determining the location of the component 11 may be generated, in accordance with the invention, e.g. by means of a dedicated conductive-trace structure 13, 13', 13" which is integrated within the substrate 10, e.g. a printed circuit board, and which may have current flowing through it. The dedicated conductive-trace structure 13, 13', 13" may comprise one or more conductive traces 13*a*-13*k*, which may be configured, e.g., as simple straight lines or as coil structures having several parallel windings.

It is because of the manner of producing printed circuit boards by means of optical exposure that a very high level of manufacturing accuracy may be achieved which will meet the requirements placed upon the knowledge of the shape of the magnetic field 14'. Here it is advantageous for the current generating a magnetic field 14' to be able to be not only switched on and off but to generate an oppositely directed magnetic field given an opposite current direction, whereby differential measurement for compensating for homogenous interference fields (e.g. the Earth's magnetic field) is possible.

If one or more vectorial magnetic field sensors 12 is/are located in a measurable vicinity of the magnetic field source 13, 13', 13", their positions in relation to the dedicated conductive-trace structure 13, 13', 13" may be unambiguously determined by the magnetic vector field. Due to the high level of manufacturing accuracy of the printed circuit board 10, it is thus possible to draw an unambiguous conclusion as to the location of the magnetic field sensor 12 in relation to the dedicated conductive-trace structure 13, 13', 13", or in relation to the printed circuit board 10.

To this end, it may be advantageous to use several dedicated conductive-trace structures 13, 13', 13" for generating different magnetic fields so as to determine, accordingly, several degrees of freedom of the location of the magnetic field sensor 12. Correctly performed, such multiple measurement also enables measuring both the thicknesses and the expansions of the dedicated conductive-trace structures 13, 13', 13" on the printed circuit board 10, which allows these further manufacturing tolerances to be taken into account.

In this manner, the positions of the magnetic field sensors 12 in relation to the dedicated conductive-trace structure 13, 13', 13" and, thus, to the printed circuit board 10 itself may be reconstructed by using calibrated magnetic field sensors 12 which measure with sufficiently accuracy. The location of the printed circuit board 10 in a subsequent application may then be referenced optically or mechanically. This measurement principle may also be applied in an electrostatic or electromagnetic manner if one uses suitable capacitive sensors or antennas instead of magnetic field sensors 12.

Integrated magnetic field sensors 12 can nowadays be magnetically calibrated by means of suitable methods without having to be brought into an external reference field. By means of a dedicated conductive-trace structure 13, 13', 13" for field generation, which has been integrated, in accordance with the invention, into the printed circuit board 10, it is now possible to determine even the last few unknown parameters for the position of the component 11 arranged on the printed circuit board 10 without having to apply a known external magnetic field (e.g. by means of a 3D Helmholtz coil) or other methods involving a large amount of expenditure.

Consequently, costly final magnetic or optical testing of components is dispensed with, and both individual magnetic sensors and sensor modules comprised of several magnetic field sensors may thus be fully calibrated without any large amount of expenditure. In addition, it is possible to re-calibrate sensors or sensor modules at a later point in time during operation so as to detect and compensate for any aging effects in sensors and the printed circuit board.

On top of this, the manufacturing quality of the PCB 10 may be assessed in that the expansion of the dedicated conductive-trace structure 13, 13', 13" may be measured (caused by scaling errors during optical exposure) and in that the thickness of the printed circuit board 10 and/or the structure of the layer construction may be determined when such dedicated conductive-trace structures 13, 13', 13" exist on all layers of the printed circuit board 10. Once the exact sensor position in relation to the dedicated conductive-trace structure 13, 13', 13" and, therefore, to the rest of the PCB 10 is known, the location of the magnetic field measurement may be unambiguously determined, which is essential for sensor technology applications.

Instead of dedicated conductive-trace structures 13, 13', 13", other components might be employed for generating a magnetic field. By discretely setting up such an arrangement with, e.g., wires or coils, a comparable system may be set up. However, if the magnetic field source is not the printed circuit board 10 itself, the advantage of the high level of manufacturing accuracy of the printed circuit board 10 will be lost, and one will have to establish the position of the component in a different manner.

Once a printed circuit board 10, which has magnetic field sensors 12 located thereon, additionally has conductive-trace structures 13, 13', 13" located thereon which serve no other purpose than to conduct electric current for generating a magnetic field 14' (e.g. fed externally or via an internal current source), one will have to assume that they are used for inventive magnetic calibration. In favor of a high signal/noise ratio, it is advantageous for the conductive-trace structure 13, 13', 13" to be located as close to the magnetic field sensors 12 as possible during measurement. Also, it would be feasible to conceal the conductive-trace structures 13, 13', 13" in the layer construction of the printed circuit board 10.

The field of application would mainly be found in magnetic field sensor technology. For example, the principle might be employed both in pure magnetic-field measurement and in subsequent applications such as positional or inertial sensor technology. Specifically applications where several magnetic field sensors 12 are employed may be improved by the inventive principle, such as magnetic field cameras and other magnetic testing instruments. Furthermore, it would be feasible for one or more magnetic sensors 12 to be integrated, as "location sensors", in the semiconductor material (e.g. silicon) of other semiconductor circuits so as to measure the location of the semiconductor material in relation to the printed circuit board 10. Examples of this would be, e.g., image sensors or receiver circuits for wireless communication.

Any aspects described herein with reference to an electromagnetic field 14' as well as to a device 12 for sensing an electromagnetic field 14' shall equally apply to an electrostatic field 14' as well as to a capacitive sensor 12. Moreover, any features described herein with reference to an electromagnetic field 14' and to a device 12 for sensing an electromagnetic field 14' may be combined with embodiments comprising an electrostatic field 14' as well as a capacitive sensor 12. In particular, any features mentioned in claims 1 to 18 with reference to an electromagnetic field 14' as well as to a device 12 for sensing an electromagnetic field 14' may be combined with the embodiments mentioned in claims 19 and 20, in particular by using an electrostatic field instead of the electromagnetic field and by using a capacitive sensor instead of the device 12 for sensing an electromagnetic field.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device.

Some or all of the method steps may be performed by a hardware device (or while using a hardware device) such as a microprocessor, a programmable computer or an electronic circuit, for example. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier. In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded. The data carrier, the digital storage medium or the computer-readable medium are typically concrete and/or non-transitory and/or non-transient.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU) or a graphics card (GPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Device for positioning a component arranged on a substrate, the device comprising:
    a substrate having arranged thereat at least one magnetic field sensor for sensing a static magnetic field, and for determining the spatial orientation of the component in relation to the substrate,
    a dedicated conductive-trace structure formed on the substrate, said dedicated conductive-trace structure being provided for generating a static magnetic field comprising a known field distribution,
    wherein the dedicated conductive-trace structure is configured to generate, upon application of an electric voltage, the static magnetic field comprising the known field distribution, and
    an evaluation device configured to sense the generated static magnetic field by means of the magnetic field sensor and to determine the spatial orientation of the component in relation to the substrate on the basis of said sensing of the static magnetic field comprising the known field distribution.

2. Method of positioning a component arranged on a substrate, the method comprising:
- providing a substrate having arranged thereat at least one magnetic field sensor for sensing a static magnetic field and for determining the spatial orientation of the component in relation to the substrate,
- generating a dedicated conductive-trace structure on the substrate, said dedicated conductive-trace structure being provided for generating a static magnetic field comprising a known field distribution,
- applying an electric voltage to the dedicated conductive-trace structure, so that the dedicated conductive-trace structure generates the static magnetic field comprising the known field distribution,
- sensing the generated static magnetic field comprising the known field distribution by means of the magnetic field sensor, and determining the spatial orientation of the component in relation to the substrate on the basis of said sensing of the static magnetic field comprising the known field distribution.

3. Method as claimed in claim 2, wherein applying the electric voltage comprises applying a DC voltage.

4. Method as claimed in claim 2, wherein the electric voltage applied to the dedicated conductive-trace structure is higher than an electric voltage used for supplying components arranged on the substrate with energy.

5. Method as claimed in claim 2, wherein producing the dedicated conductive-trace structure on the substrate comprises producing the dedicated conductive-trace structure such that it comprises one single conductive trace.

6. Method as claimed in claim 5, wherein producing the dedicated conductive-trace structure on the substrate comprises at least one conductive trace of the dedicated conductive-trace structure being produced to be configured as a straight line extending on the substrate.

7. Method as claimed in claim 2, wherein producing the dedicated conductive-trace structure on the substrate comprises producing the dedicated conductive-trace structure such that it comprises two or more conductive traces.

8. Method as claimed in claim 2, wherein producing the dedicated conductive-trace structure on the substrate comprises producing the dedicated conductive-trace structure to be configured as a coil structure comprising several parallel windings.

9. Method as claimed in claim 2, wherein producing the dedicated conductive-trace structure on the substrate comprises producing the dedicated conductive-trace structure to extend directly next to and along the magnetic field sensor.

10. Method as claimed in claim 2, wherein producing the dedicated conductive-trace structure on the substrate comprises structuring the dedicated conductive-trace structure into the substrate by means of photolithography.

11. Method as claimed in claim 2, wherein applying the electric voltage comprises applying an electric voltage comprising a first amount of voltage in a first step, so that the dedicated conductive-trace structure generates the magnetic field comprising the known field distribution, and comprises applying an electric voltage comprising a second amount of voltage in a subsequent second step, so that the dedicated conductive-trace structure generates a further magnetic field comprising a field distribution that is also known, sensing the generated further magnetic field by means of the magnetic field sensor, and determining the spatial orientation of the component in relation to the substrate on the basis of determining the difference between the magnetic field and the further magnetic field.

12. Method as claimed in claim 2, comprising producing at least one second dedicated conductive-trace structure on the substrate for generating a second magnetic field comprising a known field distribution, sensing the generated second magnetic field by means of the magnetic field sensor, and determining the spatial orientation of the component in relation to the substrate on the basis of said sensing of the magnetic field comprising the known field distribution and of said sensing of the second magnetic field comprising the known field distribution.

13. Method as claimed in claim 2, wherein applying the electric voltage to the dedicated conductive-trace structure comprises the electric voltage to be applied in a reciprocal manner at least once, so that the current flows in the opposite direction at least once and generates an oppositely directed magnetic field comprising a known field distribution, sensing the oppositely directed generated magnetic field by means of the magnetic field sensor, and determining a difference between the generated magnetic field and the generated opposite magnetic field.

14. Method as claimed in claim 2, wherein producing the dedicated conductive-trace structure on the substrate comprises producing the dedicated conductive-trace structure on the same side of the substrate on which also the magnetic field sensor is arranged.

15. Method as claimed in claim 2, wherein producing the dedicated conductive-trace structure on the substrate comprises producing the dedicated conductive-trace structure on that side of the substrate which is located opposite the magnetic field sensor.

16. Method as claimed in claim 2, wherein producing the dedicated conductive-trace structure on the substrate comprises producing a first portion of the dedicated conductive-trace structure on the same side of the substrate on which also the magnetic field sensor is arranged, and producing a second portion of the dedicated conductive-trace structure on that side of the substrate which is located opposite the magnetic field sensor.

17. Method as claimed in claim 2, wherein producing the dedicated conductive-trace structure on the substrate comprises configuring the dedicated conductive-trace structure as a buried conductive-trace structure integrated into the substrate.

* * * * *